(12) United States Patent
Jansen et al.

(10) Patent No.: US 6,727,760 B2
(45) Date of Patent: Apr. 27, 2004

(54) OUTPUT POWER CONTROL SYSTEM

(75) Inventors: Bartholomeus H. W. E. Jansen, Pacifica, CA (US); Ray Myron Parkhurst, Jr., Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/137,833

(22) Filed: May 1, 2002

(65) Prior Publication Data

US 2003/0206064 A1 Nov. 6, 2003

(51) Int. Cl.[7] .................................................. H03G 3/30
(52) U.S. Cl. ........................................ 330/285; 330/129
(58) Field of Search ................................ 330/129, 279, 330/285

(56) References Cited

U.S. PATENT DOCUMENTS

| | | | | |
|---|---|---|---|---|
| 4,849,712 A | * | 7/1989 | Jarrett | 330/283 |
| 5,146,180 A | * | 9/1992 | Hyakutake | 330/254 |
| 5,337,006 A | | 8/1994 | Miyazaki | |
| 6,008,698 A | * | 12/1999 | Dacus et al. | 330/279 |
| 6,047,167 A | | 4/2000 | Yamashita | |
| 6,194,967 B1 | | 2/2001 | Johnson et al. | |
| 6,297,698 B1 | | 10/2001 | Callahan, Jr. | |

* cited by examiner

*Primary Examiner*—Khanh Van Nguyen

(57) ABSTRACT

An output power control system includes an amplifier configured to supply a first current, a reference source configured to supply a second current which is proportional to and less than the first current, and a feedback converter responsive to the second current to control a gain of the amplifier.

38 Claims, 3 Drawing Sheets ns, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

OUTPUT POWER CONTROL SYSTEM

THE FIELD OF THE INVENTION

The present invention relates to an output power control system, and more particularly, to an output power control system for controlling output power from a power amplifier in a radio-frequency transmitter.

BACKGROUND OF THE INVENTION

Radio-frequency transmitters are used to transmit radio-frequency signals in a variety of applications. Typically the transmitters are designed to meet standards that specify output power levels and output signal rise and fall times. In many applications, output power control circuits or systems control the output power from power amplifiers employed in the radio-frequency transmitters. One type of output power control circuit includes a feedback loop that feeds back a portion of the output signal to an input of the power amplifier to control the output power. One standard that is used is the EIA Interim Standard, IS-19-B, 3.1.3.3, January 1988, USA, for the 800 MHz cellular subscriber units of the EIA system. For example, this standard specifies that the rise and fall times of the transmitted output power signal be less than two milliseconds.

A conventional output power control circuit 10 for controlling the output power of a power amplifier 12 is illustrated in FIG. 1. Output power control circuit 10 is a voltage-controlled output power control circuit which couples a percentage of the transmitted output power signal through a detector diode circuit. Power amplifier 12 has a voltage supply connection at 18 and a ground connection at 20. Power amplifier 12 transmits an input signal received at an input 14 and provides an output signal at an output 22. The output signal at output 22 is routed through a coupler 24 to provide an output signal at 26. A portion of the output power sent through coupler 24 is routed to an input 28 of a signal detector 30. Signal detector 30 responds to the peak level of the output signal at 26. Signal detector 30 includes a detecting diode and produces a detection signal at 34. A comparator 32 compares a reference voltage at 36 with the detection signal at 34. Comparator 32 provides an automatic power control voltage (Vapc) to an input 16 of power amplifier 12 to bring the detection signal at 34 in conformity with the reference voltage at 36.

One disadvantage of the conventional output power control approach employed by output power control circuit 10 are losses which reduce available output power and system efficiency. The couplers typically available for radio-frequency amplification systems are large, expensive, and have poor directivity characteristics. The poor directivity of the couplers results in poor output power accuracy, especially when the radio-frequency load impedance varies. Since the peak current loads of the power amplifiers are not monitored with this approach, the currents can be driven well above nominal levels under certain operating conditions, thereby further reducing system efficiency. For battery applications such as for mobile telephones, the result is a reduction in available talk time.

Another conventional approach used to control the output power of a power amplifier 42 is illustrated in FIG. 2. FIG. 2 illustrates a conventional current-controlled output power control circuit 40 which uses a sense resistor 54 in series with the voltage supply connection at 56 to develop a voltage proportional to the power amplifier 42 current. Power amplifier 42 has an input signal at 44 and an output signal at 52. Power amplifier 42 has a voltage supply connection at 48 which is coupled to one end of a sense resistor 54, and has a ground connection at 50. Sense resistor 54 is coupled at the other end to the voltage supply at 56. Capacitor 57 is coupled across sense resistor 54 between the voltage supply at 56 and the connection at 48 of power amplifier 42 to shunt instantaneous currents around sense resistor 54 so that sense resistor 54 conducts an average current.

The approach illustrated in FIG. 2 uses a feedback loop to convert a current through sense resistor 54 to a power control voltage at 46. A comparator 58 provides a voltage at 50 which corresponds to the current through sense resistor 54. Comparator 62 compares the voltage at 50 to a reference voltage at 64 and provides an automatic power control voltage (Vapc) at 46 to control the gain of power amplifier 42.

One disadvantage of this second approach are losses which reduce available output power and system efficiency. The sense resistors can be expensive and can be physically large. The sense resistors can also cause significant voltage drops which reduce the output power availability and efficiency of the power amplifier. This approach also has the disadvantage of having the total power amplifier current being fed back within the control loop. This can result in a loss of power control accuracy because the total current does not necessarily vary in direct proportion to the output power.

In view of the above, there is a need for an improved output power control system such as employed for controlling output power from a power amplifier in a radio-frequency transmitter.

SUMMARY OF THE INVENTION

One aspect of present invention provides an output power control system which includes an amplifier configured to supply a first current, a reference source configured to supply a second current which is proportional to and less than the first current, and a feedback converter responsive to the second current to control a gain of the amplifier.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
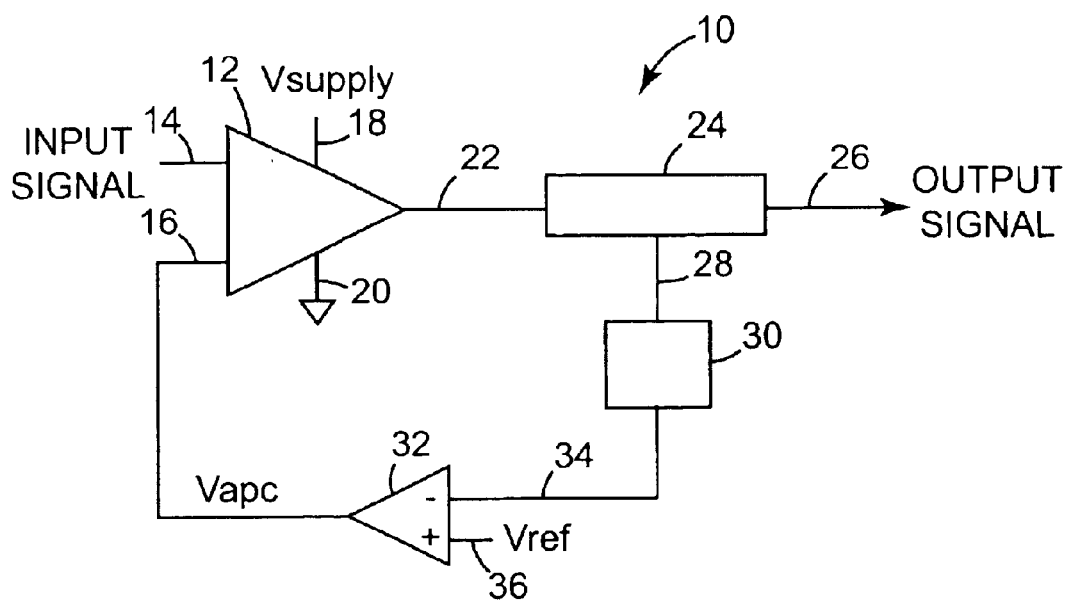
FIG. 1 illustrates a conventional voltage-controlled output power control circuit.
Figure 2:
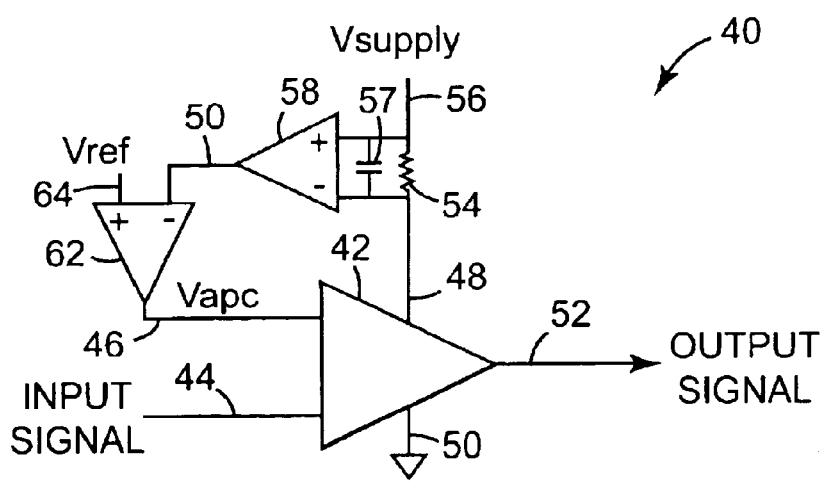
FIG. 2 illustrates a conventional current-controlled output power control circuit.
Figure 3:
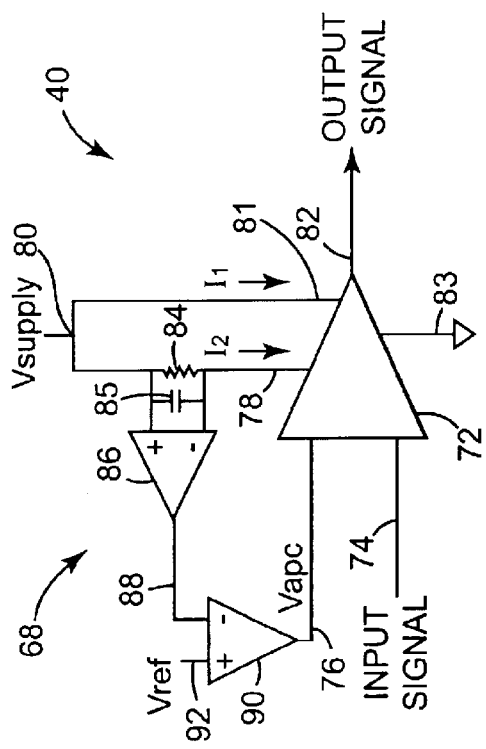
FIG. 3 is a diagram illustrating one exemplary embodiment of an output power control circuit according to the present invention.

FIG. 3 is a diagram illustrating one exemplary embodiment of an output power control circuit or system 40 according to the present invention for controlling the output power of a power amplifier 72. In the illustrated embodiment, power amplifier 72 has a transmission input signal at 74 and an output signal at 82. In one embodiment, the transmission input signal at 74 and the output signal at 82 are radio-frequency signals and power amplifier 72 is a radio-frequency amplifier. In the exemplary embodiment, power amplifier 72 is coupled to ground at 83.

Power amplifier 72 includes two connections to a voltage supply (Vsupply) provided at a node 80. The voltage supply at node 80 is coupled to power amplifier 72 via a line 81 which conducts a first current or output current ($I_1$) to an output stage 94 (shown in FIG. 4) of power amplifier 72. A feedback resistor 84 is coupled between the voltage supply at node 80 and a line 78, which is coupled to a second voltage supply connection of power amplifier 72. Capacitor 85 is coupled across feedback resistor 84 between the voltage supply at node 80 and line 78 to shunt instantaneous currents around feedback resistor 84 so that feedback resistor 84 conducts an average current. Feedback resistor 84 conducts the average current which is a second current or reference current ($I_2$) to a reference current source 96 (shown in FIG. 4) within power amplifier 72. In the exemplary embodiment, the reference current $I_2$ is proportional to and less than the output current $I_1$.

In the exemplary embodiment, a current-to-voltage converter feedback loop generally indicated at 68 controls the gain of power amplifier 72. In the exemplary embodiment, the current-to-voltage converter feedback loop 68 converts the reference current $I_2$ into a power control voltage to control the gain of power amplifier 72. In the exemplary embodiment, a feedback resistor 84, a first comparator 86, and a second comparator 90 together comprise a negative feedback loop. Feedback resistor 84 conducts the reference current $I_2$ which creates a voltage drop across resistor 84. First comparator 86 has a positive input coupled to node 80 and a negative input coupled to 78 across feedback resistor 84. First comparator 86 compares the supply voltage at node 80 to the voltage drop across resistor 84 and provides a difference between the compared voltages as a voltage on a line 88. Second comparator 90 has a negative input coupled to the voltage on line 88 and has a positive input coupled to a reference voltage (Vref) at 92. Second comparator 90 compares the reference voltage Vref at 92 to the voltage on line 88 and provides a difference between the compared voltages as an automatic power control voltage (Vapc) at 76, which is provided to an input of power amplifier 72 to control the output power of power amplifier 72.

In the exemplary embodiment, the current-to-voltage converter feedback loop 68 controls the gain of power amplifier 72 so that the output signal at 82 conforms with reference voltage Vref at 92. When the reference voltage Vref is increased or decreased, the reference current $I_2$, which corresponds to output current $I_1$ and the power output level, follows the increased or decreased reference voltage Vref.

In the exemplary embodiment, the reference current $I_2$ is proportional to and less than the output current $I_1$. In various embodiments, the reference current $I_2$ is smaller than the output current $I_1$, which allows a small and economical feedback resistor 84 to be employed in current-to-voltage converter feedback loop 68. As a result, the small and economical feedback resistor 84 can be implemented with a larger variety of resistor types, which provides greater flexibility in selecting a resistor implementation and in the optimization of loop gain parameters. In various embodiments, reference current $I_2$ closely tracks output power variations at output signal 82 thus providing better proportional tracking accuracy.

Figure 4:
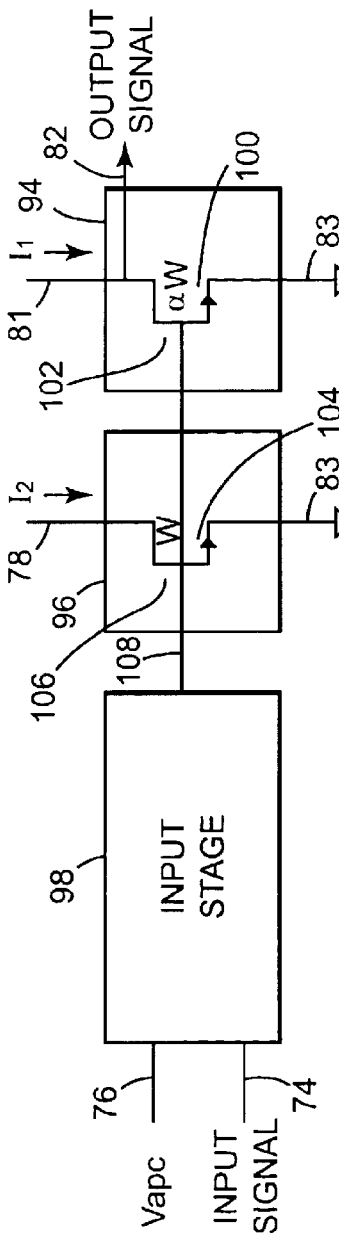
FIG. 4 is a diagram illustrating one exemplary embodiment of a power amplifier.

FIG. 4 is a diagram illustrating one exemplary embodiment of power amplifier 72. Power amplifier 72 includes an amplifier or output stage 94, a reference current source 96, and an input stage 98. In the exemplary embodiment, input stage 98 has a first input coupled to the power control voltage Vapc at 76 and a second input coupled to the transmission input signal at 74. In one embodiment, the power control voltage Vapc at 76 controls to one or more gates of field effect transistors (FETs) employed within input stage 98. The amplification gain is varied by varying the gate voltages so that a predetermined output signal is generated which corresponds to the power control voltage Vapc at 76.

In the exemplary embodiment, input stage 98 has an output 108 which is coupled to a gate 106 of a reference transistor 104 in reference current source 96, and a gate 102 of an output transistor 100 in output stage 94. Reference current source 96 conducts reference current $I_2$ via line 78 to ground 83. Output stage 94 conducts output current $I_1$ via line 80 to ground 83. Output transistor 100 includes a drain which provides the output signal at 82. In one embodiment, reference transistor 104 and output transistors 100 are complementary metal-oxide semiconductor (CMOS) transistors. In one embodiment, reference transistor 104 and output transistor 100 are enhancement-mode pseudomorphic high-electron mobility (E-pHEMT) transistors. In one embodiment, reference transistor 104 and output transistor 100 are silicon bipolar transistors. In one embodiment, reference transistor 104 and output transistor 100 are heterojunction bipolar transistors.

In the exemplary embodiment, reference transistor 104 is proportionally sized to be smaller than output transistor 100 in order to conduct a smaller current. The ratio of the width-to-length (referred to hereinafter as "W/L") of a gate of a semiconductor device, such as a CMOS transistor, determines the transistor size and the maximum current which can be conducted by the transistor. Typically the length L of the gate is a fixed value corresponding to a minimum feature size of the semiconductor fabrication process used to fabricate the transistors. Consequently, the transistor sizes are typically varied by varying the gate width W of the transistor. Two given transistors having two different gate W/L ratios and which are fabricated in close proximity on a given wafer will have comparative current ratios which track with minimal variance from wafer to wafer within a given lot of wafers being fabricated. In one embodiment, reference transistor 104 and output transistor 100 are silicon bipolar transistors and the maximum current conducted by the transistors is controlled by varying the transistor emitter widths. In one embodiment, reference transistor 104 and output transistor 100 are heterojunction bipolar transistors and the maximum current conducted by the transistors is controlled by varying the transistor emitter widths.

In the illustrated embodiment, output transistor 100 has a width $\alpha W$ and reference transistor 104 has a width W. The factor $\alpha$ is a constant which is used to specify the current ratio of the reference current $I_2$ to the output current $I_1$. In various embodiments, the reference current $I_2$ is smaller than the output current $I_1$ to minimize losses to the circuit and to reduce power loss caused by feedback resistor 84. Since the gate 106 of reference transistor 104 is coupled to the gate 102 of output transistor 100, the reference current $I_2$ has a value which is substantially equal to $1/\alpha$ times the output current $I_1$. In the exemplary embodiment, the gate length L is substantially the same for both reference transistor 104 and output transistor 100. In other embodiments, the gate length L of reference transistor 104 is not the same as the gate length L of output transistor 100.

The gate W/L ratios of reference transistor 104 and output transistor 100 can be any suitable value. In one example embodiment, the W/L ratio of output transistor 100 is a relatively large value which is greater than 5000 because output transistor 100 drives the output signal at 82. In this example embodiment, the W/L ratio of reference transistor 104 and output transistor 100 is less than 5000. In one embodiment, the value of $\alpha$ is 10 such that the W/L ratio of reference transistor 104 is 1/10th of the W/L ratio of output transistor 100 and the reference current $I_2$ is substantially equal to 1/10 times the output current $I_1$. In one embodiment, the value of $\alpha$ is 100 such that the W/L ratio of reference transistor 104 is 1/100th of the W/L ratio of output transistor 100 and the reference current $I_2$ is substantially equal to 1/100 times the output current $I_1$.

Figure 5A:
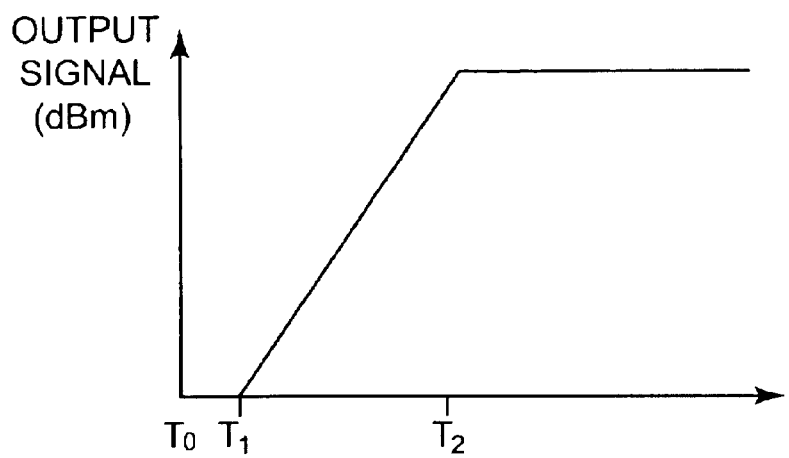
FIG. 5A is a diagram illustrating the output signal power versus time for an exemplary embodiment of an output power control circuit.
Figure 5B:
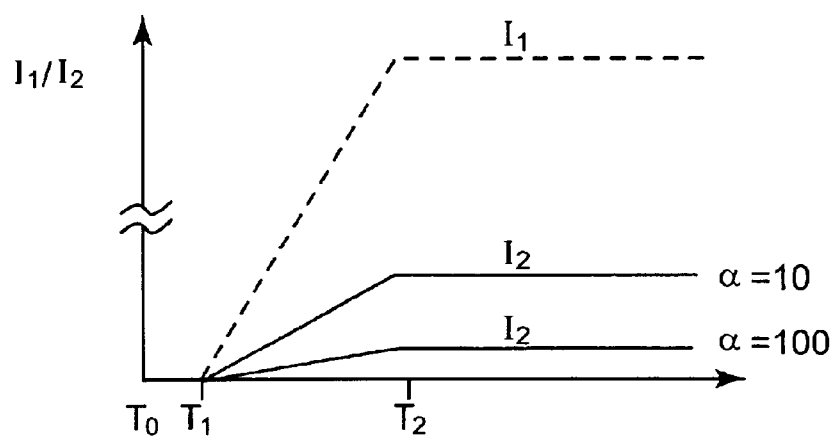
FIG. 5B is a diagram illustrating an output current $I_1$ and a reference current $I_2$ versus time for an exemplary embodiment of an output power control circuit.
Figure 5C:
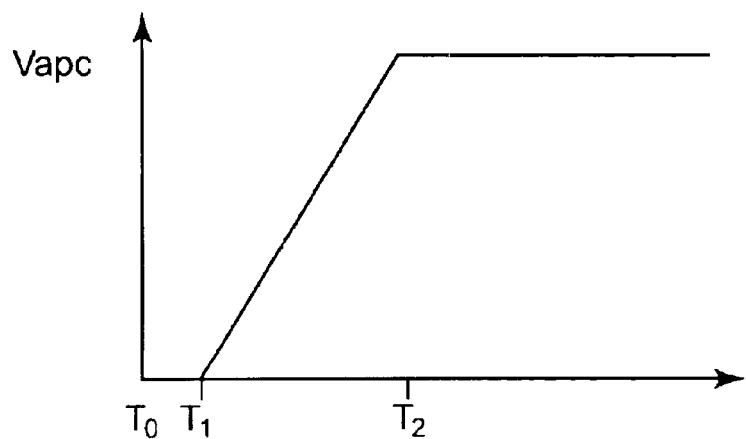
FIG. 5C is a diagram illustrating a power control voltage versus time for an exemplary embodiment of an output power control circuit.

FIG. 5A is a diagram illustrating the output signal power versus time for an exemplary embodiment of output power control circuit 40. FIG. 5B is a diagram illustrating the output current $I_1$ and the reference current $I_2$ versus time for an exemplary embodiment of the output power control circuit 40. FIG. 5C is a diagram illustrating the automatic power control voltage Vapc versus time for an exemplary embodiment of the output power control circuit.

In the exemplary embodiment, from time $T_0$ to time $T_1$, power amplifier 72 is not activated and is not transmitting the output signal at 82; reference transistor 104 and output transistor 100 are turned off; the reference current $I_2$ and the output current $I_1$ illustrated in FIG. 5B are zero; the output signal power illustrated in FIG. 5A is zero; and the automatic power control voltage Vapc illustrated in FIG. 5C is zero.

In the exemplary embodiment, at time $T_1$, a transmission input signal at 74 is received by power amplifier 72. The transmission input signal at 74 is amplified with a gain by power amplifier 72, and the transmitted power at output signal 82 begins to rise between time $T_1$ and time $T_2$. In the exemplary embodiment, from $T_1$ to $T_2$, output transistor 100 is beginning to conduct the output current $I_1$ and the value of the output current $I_1$ begins to rise. Since the gate 106 of reference transistor 104 is coupled to the gate 102 of output transistor 100, the reference current $I_2$ begins to rise as well. In the exemplary embodiment, the magnitude of the reference current $I_2$ is less than the magnitude of the output current $I_1$. FIG. 5B illustrates the output current $I_1$ with a dashed line and two values of reference current $I_2$ for $\alpha=10$ and $\alpha=100$ with solid lines. The current axis is shown as broken to simplify the illustration of the invention, because the reference current $I_2$ is much smaller than the output current $I_1$ in the exemplary embodiment. In the exemplary embodiment, from $T_1$ to $T_2$, the value of reference current $I_2$ for $\alpha=10$ and $\alpha=100$ is substantially equal to a value of 1/10th and 1/100th, respectively, of the output current $I_1$.

In the exemplary embodiment, the power control voltage Vapc illustrated in FIG. 5C is the output of the negative feedback loop which includes feedback resistor 84, first comparator 86, and second comparator 90. In the exemplary embodiment, since the delay of the negative feedback loop is negligible, the power control voltage Vapc rises in substantially direct proportion to the reference current $I_2$ to thereby minimize the rise time of the output signal power in FIG. 5A. As a result, the output signal power level at 82 of power amplifier 72 quickly follows the change in the automatic power control voltage Vapc until the time $T_2$, at which the output signal power level at 82 corresponds to the automatic power control voltage Vapc at 76. In the exemplary embodiment, the automatic power control voltage Vapc at 76 is controlled by the reference voltage Vref at 92 such that the output signal power level at 82 also corresponds to the reference voltage Vref at 92.

In the exemplary embodiment, at $T_2$, a desired output signal power level at 82 has been reached and the power control voltage Vapc at 76 illustrated in FIG. 5C reaches a steady state. The output current $I_1$ and the reference current 12 illustrated in FIG. 5B also reach a steady state. Since the output current $I_1$ is at a steady state value, the output signal illustrated in FIG. 5A is at a steady state value.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An output power control system, comprising:
    an amplifier configured to supply a first current and including a reference source configured to supply a second current which is proportional to and less than the first current; and
    a feedback converter responsive to the second current to control a gain of the amplifier, the feedback converter including a current-to-voltage converter for converting the second current into a power control voltage.

2. The output power control system of claim 1, wherein the current-to-voltage converter comprises:
    a resistor coupled to a supply voltage to conduct the second current;
    a first comparator configured to compare the supply voltage to a voltage drop across the resistor and to output a difference between as an output voltage; and
    a second comparator configured to compare the output voltage to a reference voltage and to output a difference between as the power control voltage.

3. The output power control system of claim 1, wherein the second current is substantially equal to $1/\alpha$ times the first current, wherein $\alpha$ is a constant which is greater than one.

4. The output power control system of claim 1, wherein the amplifier further includes:
    an input stage configured to apply the power control voltage to control the gain.

5. The output power control system of claim 1, wherein the amplifier is a radio-frequency amplifier.

6. An output power control system, comprising:

an amplifier configured to supply a first current and including a reference source configured to supply a second current which is proportional to and less than the first current, wherein the second current is substantially equal to $1/\alpha$ times the first current, wherein $\alpha$ is a constant which is greater than one, and including a first transistor having a width $\alpha W$ which conducts the first current; and a feedback converter responsive to the second current to control a gain of the amplifier.

7. The output power control system of claim 6, wherein the reference source comprises:

a second transistor having a width W which is coupled to a resistor to conduct the second current, wherein a gate of the second transistor is coupled to a gate of the first transistor so that the second current is substantially equal to $1/\alpha$ times the first current.

8. The output power control system of claim 7, wherein $\alpha$ is equal to or greater than 10.

9. The output power control system of claim 7, wherein the first and second transistors are complementary metal-oxide semiconductor transistors.

10. The output power control system of claim 7, wherein the first and second transistors are enhancement-mode pseudomorphic high-electron mobility transistors.

11. An output power control system, comprising:

an amplifier configured to amplify an input signal with a gain corresponding to a power control voltage to produce an output signal the amplifier including a mirror reference current source configured to supply a first current and a second current, wherein the second current is proportional to and less than the first current; and a negative feedback converter configured to convert the second current into the power control voltage to control the gain, the negative feedback converter comprising:

a resistor coupled to a supply voltage to conduct the second current;

a first comparator configured to compare the supply voltage to a voltage drop across the resistor and to output a difference between as an output voltage; and a second comparator configured to compare the output voltage to a reference voltage and to output a difference between as the power control voltage.

12. The output power control system of claim 11, wherein the mirror reference current source comprises:

a first transistor having a width $\alpha W$ to conduct the first current; and a second transistor having a width W which is coupled to the resistor to conduct the second current, wherein a gate of the first transistor is coupled to a gate of the second transistor so that the second current is substantially equal to $1/\alpha$ times the first current wherein $\propto$ is a constant which is greater than one.

13. The output power control system of claim 12, wherein $\alpha$ is equal to or greater than 10.

14. The output power control system of claim 12, wherein the first and second transistors are complementary metal-oxide semiconductor transistors.

15. The output power control system of claim 12, wherein the first and second transistors are enhancement-mode pseudomorphic high-electron mobility transistors.

16. The output power control system of claim 12, wherein the first and second transistors are silicon bipolar transistors.

17. The output power control system of claim 12, wherein the first and second transistors are heterojunction bipolar transistors.

18. A current mirror power control circuit, comprising:

a radio-frequency power amplifier having a power control voltage input, wherein the radio-frequency power amplifier amplifies a radio-frequency input signal with a gain corresponding to the power control voltage;

a reference transistor having a width W which conducts a reference current;

an output transistor having a width $\alpha W$ which conducts an output current which is greater than the reference current, wherein the reference current is proportional to the output current, and wherein the output transistor is configured to provide a radio-frequency output signal wherein $\propto$ is a constant which is greater than one; and a negative feedback circuit configured to convert the reference current into the power control voltage.

19. The current mirror power control circuit of claim 18, wherein the negative feedback converter comprises:

a resistor coupled to a supply voltage to conduct the reference current;

a first comparison circuit configured to compare the supply voltage to a voltage drop across the resistor and to output a difference between as an output voltage; and a second comparison circuit configured to compare the output voltage to a reference voltage and to output a difference between as the power control voltage.

20. The current mirror power control circuit of claim 18, wherein $\alpha$ is equal to or greater than 10.

21. The current mirror power control circuit of claim 18, wherein the reference and output transistors are complementary metal-oxide semiconductor transistors.

22. The current mirror power control circuit of claim 18, wherein the reference and output transistors are enhancement-mode pseudomorphic high-electron mobility transistors.

23. A radio-frequency power amplifier, comprising:

an input stage configured to control transmission of a radio frequency input signal with a gain corresponding to a power control voltage signal;

an output stage configured to provide an output current and a radio-frequency output signal;

a reference stage configured to provide a reference current which is proportional to and less than the output current; and a current-to-voltage feedback converter configured to convert the reference current into the power control voltage signal, the current to voltage feedback converter comprising:

a resistor coupled to a supply voltage to conduct the reference current;

a first comparator configured to compare the supply voltage to a voltage drop across the resistor and to output a difference between as an output voltage; and a second comparator configured to compare the output voltage to a reference voltage and to output a difference between as the power control voltage signal.

24. The radio-frequency power amplifier of claim 23, wherein the output stage includes:

an output transistor having a width $\alpha W$ which conducts the output current which $\propto$ is a constant which is greater than one.

25. The radio-frequency power amplifier of claim 24, wherein the reference stage includes:

a reference transistor having a width W which is coupled to the resistor to conduct the reference current, wherein a gate of the reference transistor is coupled to a gate of the output transistor so that the reference current is substantially equal to 1/α times the output current.

26. The radio-frequency power amplifier of claim 25, wherein α is equal to or greater than 10.

27. The radio-frequency power amplifier of claim 25, wherein the reference and output transistors are complementary metal-oxide semiconductor transistors.

28. The radio-frequency power amplifier of claim 25, wherein the reference and output transistors are enhancement-mode pseudomorphic high-electron mobility transistors.

29. The radio-frequency power amplifier of claim 25, wherein the reference and output transistors are silicon bipolar transistors.

30. The radio-frequency power amplifier of claim 25, wherein the reference and output transistors are heterojunction bipolar transistors.

31. An output power control system, comprising:
    an amplifier configured to control a first current and including a reference means to supply a second current which is proportional to and less than the first current; and
    feedback means responsive to the second current to control a gain of the amplifier, the feedback means comprising:
        a current-to-voltage converter for converting the second current into a power control voltage.

32. The output power control system of claim 31, wherein the feedback means further comprises:
    a resistor coupled to a supply voltage to conduct the second current;
    a first comparator configured to compare the supply voltage to a voltage drop across the resistor and to output a difference between as an output voltage; and
    a second comparator configured to compare the output voltage to a reference voltage and to output a difference between as the power control voltage.

33. The output power control system of claim 32, wherein the amplifier includes:
    a first transistor having a width αW which conducts the first current wherein α is a constant which is greater than one.

34. The output power control system of claim 33, wherein the reference means comprises:
    a second transistor having a width W which is coupled to the resistor to conduct the second current, wherein a gate of the second transistor is coupled to a gate of the first transistor so that the second current is substantially equal to 1/α times the first current.

35. The output power control system of claim 34, wherein α is equal to or greater than 10.

36. A method of controlling the output power of an amplifier, the method comprising:
    providing an output current;
    providing a reference current which is proportional to and less than the output current; and
    converting the reference current into a power control voltage to control a gain of the amplifier wherein the converting of the reference current into the power control voltage comprises:
        comparing the supply voltage to a voltage drop across a resistor and providing a difference between as an output voltage; and
    comparing the output voltage to a reference voltage and providing a difference between as the power control voltage.

37. The method of claim 36, wherein the providing of the output current comprises:
    providing an output transistor having a width αW wherein α is a constant which is greater than one; and
    conducting the output current through the output transistor.

38. A method of controlling the output power of an amplifier, the method comprising:
    providing an output transistor having a width αW;
    conducting an output current through the output transistor;
    providing a reference transistor having a width W;
    coupling a gate of the reference transistor to a gate of the output transistor;
    conducting a reference current through the reference transistor wherein the reference current is substantially equal to 1/α times the output current wherein α is a constant which is greater than one; and
    converting the reference current into a power control voltage to control a gain of the amplifier.

* * * * *